United States Patent
Oh et al.

(10) Patent No.: US 7,598,159 B2
(45) Date of Patent: Oct. 6, 2009

(54) METHOD OF FABRICATING THIN FILM TRANSISTOR SUBSTRATE AND THIN FILM TRANSISTOR SUBSTRATE PRODUCED USING THE SAME

(75) Inventors: Hwa-yeul Oh, Suwon-si (KR); Byoung-june Kim, Seoul (KR); Sung-hoon Yang, Seoul (KR); Jae-ho Choi, Seoul (KR); Yong-mo Choi, Suwon-si (KR); Girotra Kunal, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 165 days.

(21) Appl. No.: 11/746,328

(22) Filed: May 9, 2007

(65) Prior Publication Data

US 2008/0108226 A1 May 8, 2008

(30) Foreign Application Priority Data

Nov. 7, 2006 (KR) .................... 10-2006-0109514

(51) Int. Cl.
*H01L 21/00* (2006.01)

(52) U.S. Cl. .................... 438/482; 438/762; 257/52; 257/E21.15; 257/E27.114

(58) Field of Classification Search .................. 438/482, 438/485, 762; 257/52, 75, E21.15, E27.114; 427/255.393, 255.27, 255.18
See application file for complete search history.

(56) References Cited

U.S. PATENT DOCUMENTS 5,796,116 A * 8/1998 Nakata et al. .................. 257/66

FOREIGN PATENT DOCUMENTS

| JP | 05-335577 | 12/1993 |
|---|---|---|
| JP | 08-051214 | 2/1996 |
| JP | 08-335703 | 12/1996 |

* cited by examiner

*Primary Examiner*—Caridad M Everhart
(74) *Attorney, Agent, or Firm*—Cantor Colburn LLP

(57) ABSTRACT

A method of fabricating a thin film transistor substrate includes forming a gate wiring on an insulating substrate and forming a gate insulating layer on the gate wiring; performing a first hydrogen plasma treatment with respect to the gate insulating layer; forming a first active layer with a first thickness at a first deposition rate on the gate insulating layer; performing a second hydrogen plasma treatment with respect to the first active layer; and forming a second active layer with a second thickness greater than the first thickness at a second deposition rate greater than the first deposition rate, on the first active layer.

23 Claims, 7 Drawing Sheets

METHOD OF FABRICATING THIN FILM TRANSISTOR SUBSTRATE AND THIN FILM TRANSISTOR SUBSTRATE PRODUCED USING THE SAME

This application claims priority to Korean Patent Application No. 10-2006-0109514, filed on Nov. 7, 2006, and all the benefits accruing therefrom under 35 U.S.C. § 119, the contents of which in its entirety are herein incorporated by reference.

BACKGROUND OF THE INVENTION

1. Field of the Invention

The present invention relates generally to a method of fabricating a thin film transistor substrate and a thin film transistor substrate produced by the same, and more particularly to a method of fabricating a thin film transistor substrate that can improve the carrier mobility in a channel region.

2. Description of the Prior Art

Liquid crystal displays "LCDs," which are currently the most widely used flat panel displays, include two substrates having electrodes formed thereon, and a liquid crystal layer interposed between the substrates. The liquid crystal display controls the amount of light transmitted through the liquid crystal layer by applying a voltage to the electrodes to rearrange liquid crystal molecules of the liquid crystal layer. The demand for large LCDs having a high resolution continues to increase.

More specifically, an LCD includes two substrates: one substrate (thin film transistor substrate) includes a plurality of pixel electrodes arranged in the form of a matrix, and the other substrate (common electrode substrate) has one common electrode covering the front surface of the common electrode substrate. In such an LCD, image display is achieved by applying a separate voltage to each pixel electrode. To this end, thin film transistors, which are three-terminal elements, are connected to the pixel electrodes, respectively, in order to control the voltage applied to each corresponding pixel electrode. In addition, a gate line for transferring a signal to control the thin film transistor, a data line for transferring a voltage applied to the pixel electrode, a source electrode connected to the data line, and a drain electrode spaced from and opposed to the source electrode are each formed on the substrate. The source electrode and the drain electrode are connected to each other by an active layer pattern and an ohmic contact layer pattern, which are located beneath the electrodes.

In driving such a thin film transistor, a gate-on signal Von is applied to the gate electrode, thereby transferring carrier from the source electrode to the drain electrode via a channel region; that is, via an active layer pattern exposed in a space in which the source and drain electrodes are spaced apart from each other. However, since a conventional active layer pattern has poor film quality, carrier mobility is low. To address such a problem, methods of increasing the width of the channel or decreasing the length of the channel have been researched, but such methods are also problematic in that an aperture ratio decreases and the size of the thin film transistor substrate increases.

Therefore, it would be desirable to be able to improve the carrier mobility in the channel region so as to increase the aperture ratio of the thin film transistor substrate, to decrease the size of the thin film transistor and to reduce the fabrication cost.

BRIEF SUMMARY OF THE INVENTION

Accordingly, aspects of the present invention solve the above-mentioned problems, and exemplary embodiments of the present invention provide a thin film transistor substrate which can improve the carrier mobility in a channel region by performing a hydrogen plasma treatment with respect to the active layer and the like.

Exemplary embodiments of the present invention also provide a thin film transistor substrate fabricated by the fabrication method.

In one aspect, a method of fabricating a thin film transistor substrate includes forming a gate wiring on an insulating substrate and forming a gate insulating layer on the gate wiring; performing a first hydrogen plasma treatment with respect to the gate insulating layer; forming a first active layer with a first thickness at a first deposition rate on the gate insulating layer; performing a second hydrogen plasma treatment with respect to the first active layer; and forming a second active layer, with a second thickness greater than the first thickness at a second deposition rate greater than the first deposition rate, on the first active layer.

In another aspect, there is provided a thin film transistor substrate including a gate wiring formed on an insulating substrate; a gate insulating layer formed on the gate wiring; a first active layer formed with a first thickness on the gate insulating layer, in which a ratio of a number of Si—H bonds to a number of Si—$H_2$ bonds is within the range of about 15:1 to about 30:1; and a second active layer formed with a second thickess greater than the first thickness on the first active layer, in which a ratio of a number of Si—H bonds to a number of Si—$H_2$ bonds is within the range of about 0.1:1 to about 14.9:1.

BRIEF DESCRIPTION OF THE DRAWINGS

The above and other objects, features and advantages of the present invention will be apparent from the following detailed description taken in conjunction with the accompanying drawings, in which.

DETAILED DESCRIPTION OF THE INVENTION

Figure 1:
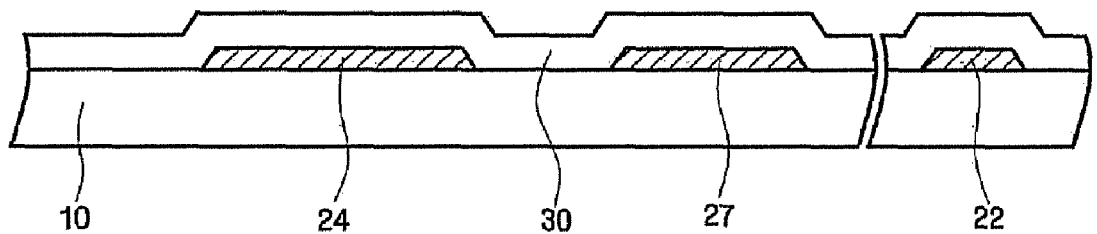
FIGS. 1 to 12 are cross-sectional views illustrating a method of fabricating a thin film transistor substrate according to a first embodiment of the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

A method of fabricating a thin film transistor substrate according to a first embodiment of the present invention will be described in detail with reference to FIGS. 1 to 12. FIGS. 1 to 12 are cross-sectional views illustrating a method of fabricating a thin film transistor substrate according to a first embodiment of the present invention.

First, referring to FIG. 1, a gate wiring 22, 24 and 27, including a gate line 22, a gate electrode 24 and a storage wiring 27, is formed on an insulating substrate 10.

Next, a gate insulating layer 30 made of silicon nitride ($SiN_x$), for example is deposited at a thickness of about 150 to about 500 nm on the gate wiring 22, 24 and 27, for example, by means of chemical vapor deposition "CVD." The gate insulating layer 30 may be formed to have a double-layered structure by applying different deposition rates in order to improve film quality. More specifically, the gate insulating layer 30 may be formed in such a manner that a lower layer is deposited at a high rate so as to have a relatively porous film quality, and an upper layer is deposited at a low rate so as to have a relatively dense film quality. When a gate-on signal Von is applied, a channel is formed in a first active layer pattern (described in further detail later). Therefore, in order to improve carrier mobility, it is desirable for the upper layer of the gate insulating layer 30 adjacent to the first active layer pattern to be formed so as to have a dense film quality. By way of example, if the total thickness of the gate insulating layer 30 is about 450 nm, the gate insulating layer 30 may be formed in such a manner that the upper layer deposited at a high rate has a thickness of about 400 nm, and the lower layer deposited at a low rate has a thickness of about 50 nm.

Figure 2:
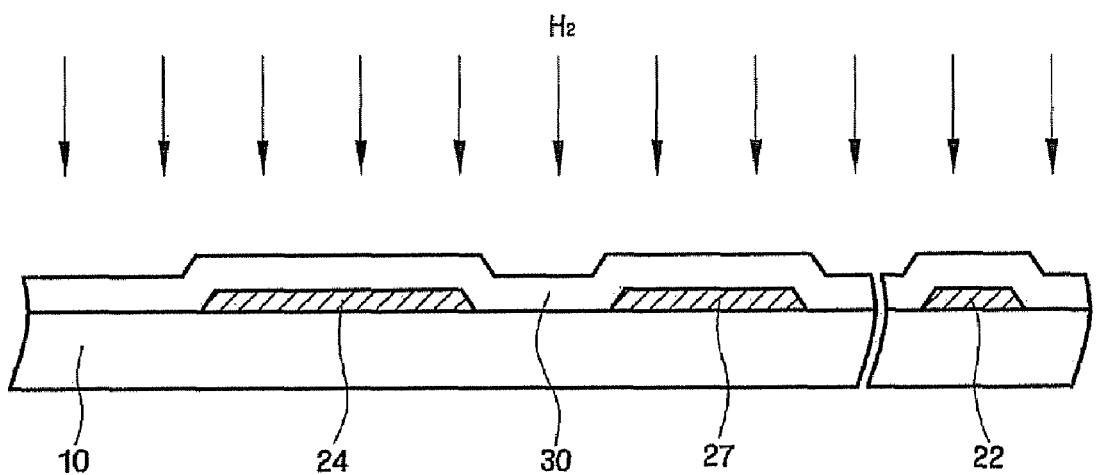

Referring to FIG. 2, a first hydrogen plasma treatment is performed on the gate insulating layer 30. Once the gate insulating layer 30 has been subjected to the first hydrogen plasma treatment, the number of defects is reduced and surface roughness is lowered, so that the gate insulating layer 30 is flattened and made denser. Accordingly, it is possible to improve carrier mobility because the densities of trap sites preventing carriers such as electrons or holes from transferring according to the channel are decreased. The first hydrogen plasma treatment is performed under the same conditions as those of a second hydrogen plasma treatment (described later).

Figure 3:
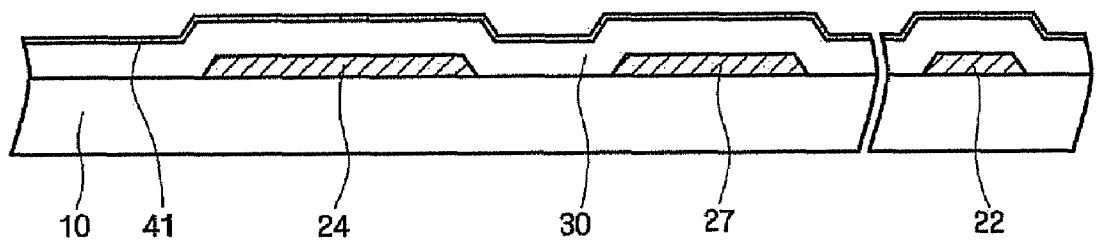

Referring to FIG. 3, for example, hydrogenated amorphous silicon or polycrystalline silicon is deposited at a first deposition rate on the gate insulating layer 30, which has been subjected to the first hydrogen plasma treatment, thereby forming a first active layer 41 with a first thickness.

Since the first active layer 41 forms an interface with the gate insulating layer 30, the first deposition rate may be set to a low rate of, for example, about 0.6 to about 1.2 nm/s. In this case, an exemplary deposition temperature range may be from about 150 to about 350° C., based on the specific deposition equipment and film quality to be formed. By depositing hydrogenated amorphous silicon or the like at the first deposition rate and at the deposition temperature, the first active layer 41 having a first thickness of, for example, about 10 to about 30 nm, may be formed. In one embodiment, the first thickness is about 15 nm. Since the first active layer 41 is formed to have the first thickness, hydrogen may be smoothly diffused into the first active layer 41 during a subsequent second hydrogen plasma treatment process with respect to the first active layer 41.

The hydrogenated amorphous silicon used to form the first active layer 41 may obtained by diluting silane $SiH_4$ with hydrogen $H_2$, and in accordance with an exemplary embodiment of the present invention, the composition ratio of silane to hydrogen may be from about 1:4 to about 1:8. As compared with a deposition performed using only silane, carrier mobility is significantly improved when silane is diluted with hydrogen at the aforementioned composition ratio. This was confirmed by experimental results (described later). When the ratio of silane to hydrogen, the deposition rate, deposition temperature and the thickness of the first active layer are the same as the aforementioned conditions, the first active layer 41 has the best film quality to provide the highest carrier mobility, which was also confirmed by experimental results (described later).

Figure 4:
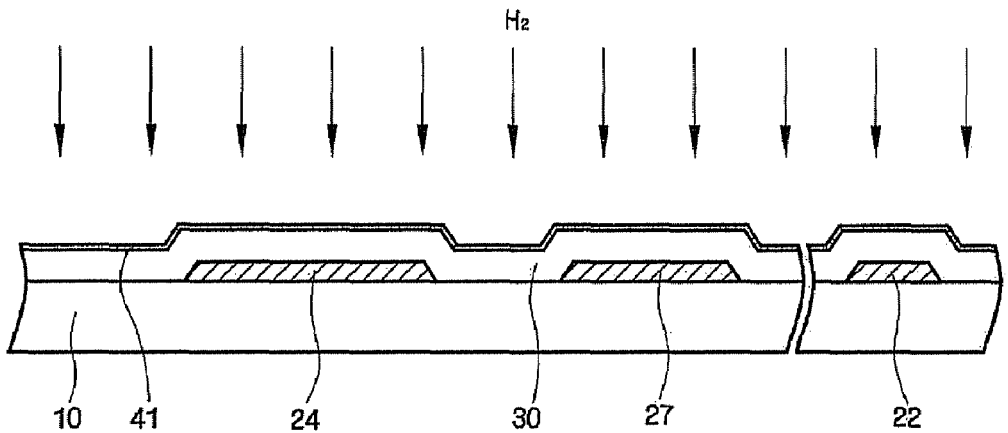

Referring to FIG. 4, the second hydrogen plasma treatment is performed with respect to the deposited first active layer 41. The second hydrogen plasma treatment may be performed in the same chamber used for the deposition of the first active layer 41. First, gas used in deposition of the first active layer 41 is pumped and removed from the chamber, and then the inside of the chamber is cleaned. Thereafter, hydrogen gas is injected into the chamber and a power supply is applied, thereby forming hydrogen plasma.

When the first active layer 41 is formed by depositing hydrogenated amorphous silicon, there are Si—Si bonds, Si—H bonds and Si—$H_2$ bonds in the first active layer 41. Silicon (Si) is a 4-valent atom that has four bonds, one or more of which may be in an inferior bonding state such as a weak bond, a dangling bond, etc. When a defect (e.g., such an inferior bonding and/or an inferior state in the surface roughness_occurs, the film quality of the first active layer 41 becomes poor, which may lower carrier mobility. In order to prevent such a problem, the second hydrogen plasma treatment is performed with respect to the first active layer 41, thereby improving the film quality. In order to improve the film quality, the first active layer 41 is prevented from being damaged in the plasma treatment, and material forming the plasma is sufficiently diffused into the first active layer 41. Hydrogen is small in size, is easily diffusible, and has only a small possibility of damaging the first active layer 41, and thus hydrogen may be useful in improving the film quality of the first active layer 41. In order to form an optimum film quality on the first active layer 41, power per unit area supplied to the chamber in the second hydrogen plasma treatment may be, for example, about 0.04 to about 0.06 $W/cm^2$. Other exemplary processing conditions include for example: an applied chamber pressure of about 1000 to about 1600 mT; a hydrogen flow rate of about 1000 to about 2000 sccm; and a processing time of about 60 to about 120 seconds.

The film quality of the first active layer 41 becomes better as the bonds forming the first active layer 41 include more Si—Si bonds and Si—H bonds, while the film quality of the first active layer 41 becomes worse as the bonds forming the first active layer 41 include more Si—$H_2$ bonds, which are unstable bonds. The first active layer 41, which has been subjected to the second hydrogen plasma treatment step, has a dense film quality. That is, through the hydrogen diffusion by the hydrogen plasma treatment, the first active layer 41 has more Si—H bonds than Si—$H_2$ bonds, thereby having a dense film quality characteristic. More specifically, it is possible to obtain excellent film quality in which the ratio of the number of Si—H bonds to the number of Si—$H_2$ bonds is within a range of about 15:1 to about 30:1. This was confirmed in experimental results (described later).

Figure 5:
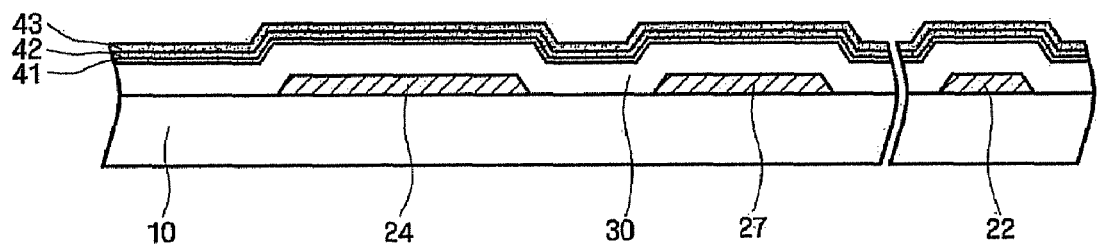

Then, referring to FIG. 5, hydrogenated amorphous silicon is deposited at a first rate on the first active layer 41, which has been subjected to the second hydrogen plasma treatment, thereby forming a third active layer 42 having a third thickness. The third active layer 42 may be deposited under the same conditions as those for the first active layer 41. In one embodiment, the third thickness may be, for example, 40 to 60 nm. Consequently, both the first active layer 41 and third active layer 42 have dense film qualities, and the sum of the thicknesses of the two layers may be, for example, 70 nm. The third active layer 42 has the same film quality as that of the first active layer 41 before the plasma treatment, thereby providing high carrier mobility. When sufficient carrier mobility can be obtained even with only the first active layer 41 which has been plasma-processed, it is possible to omit the third active layer 42 in order to reduce the process time.

Next, for example, hydrogenated amorphous silicon or polycrystalline silicon is deposited at a second deposition rate higher than the first deposition rate on the third active layer 42 or on the first active layer 41 which has been plasma-processed, thereby forming a second active layer 43 with a second thickness greater than the first thickness. It is possible to reduce the process time by setting the second deposition rate to a higher value than the first deposition rate, in which the second deposition rate may be set to, for example, about 1.5 to about 2.5 nm/s. The second active layer 43 may be formed to have, for example, a thickness of 130 nm by depositing hydrogenated amorphous silicon or the like at the second deposition rate. Since the second active layer 43 is deposited at the second deposition rate (greater than that for the first active layer 41) and is not subjected to a hydrogen plasma treatment, the ratio of Si—H bonds to Si—$H_2$ bonds in the second active layer 43 may be a value within a range of about 0.1:1 to about 14.9:1, which is smaller than that of the first active layer 41.

Figure 6:
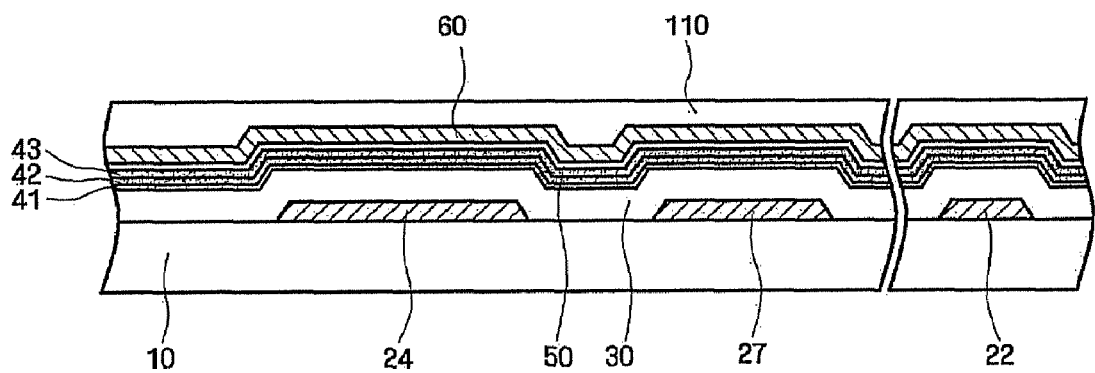

Then, referring to FIG. 6, a doped amorphous silicon layer 50 is deposited on the second active layer 43, for example, with a thickness of 50 nm, by means of chemical vapor deposition. Then, a conductive layer 60 for data wiring is formed on the doped amorphous silicon layer 50 by means of sputtering or the like. The conductive layer 60 for data wiring may be a multi-layer which includes, for example, molybdenum, aluminum and molybdenum. Next, photoresist 110 is applied to the top of the conductive layer 60 for data wiring.

Figure 7:
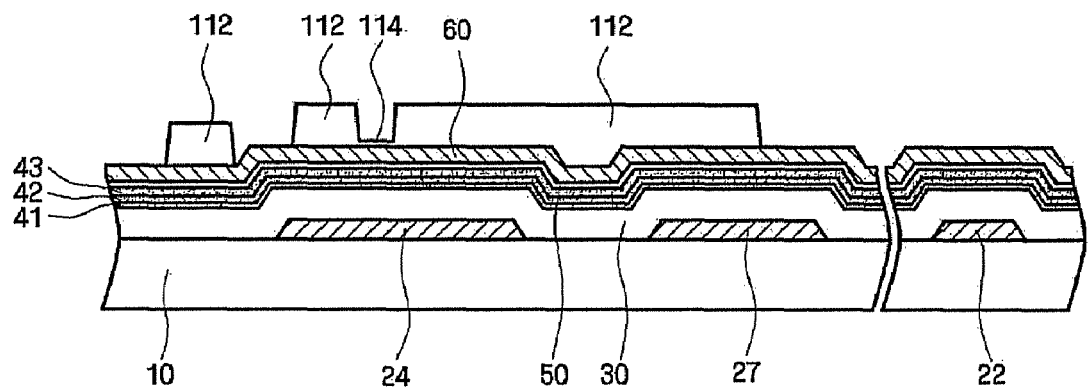

Thereafter, referring to FIGS. 6 and 7, light is irradiated on the photoresist 110 through an etching mask (not shown), and the photoresist 110 is developed, thereby forming a photoresist pattern including a first region 112 and a second region 114. The second region is 114 located at a channel portion of a thin film transistor, that is, between a subsequently formed source electrode and drain electrode at a thickness smaller than that of the first region 112, located at a data wiring portion in which a data wiring is formed. The remaining photoresist in other regions, except for the channel portion and data wiring portion, is then removed. In this case, the ratio of the thickness of the second region 114 remaining on the channel portion to the thickness of the first region 112 remaining on the data wiring portion may be changed depending on the process conditions of an etching process, which will be described later, such that (for example) the thickness of the second region 114 is half or less than half of the first region 112.

There are various methods of forming the photoresist to have different, position dependent thicknesses. Generally, in order to control the amount of light transmission, a slit or lattice pattern is formed, or a semitransparent film is used. In the present application, it is desirable that the line width of the pattern between slits or the interval between the patterns, i.e., the width of the slit is established to be smaller than the resolution of a light exposure system used in an exposing process. When the semitransparent film is used, thin films with different light transmittances or with different thicknesses may be used.

Figure 8:
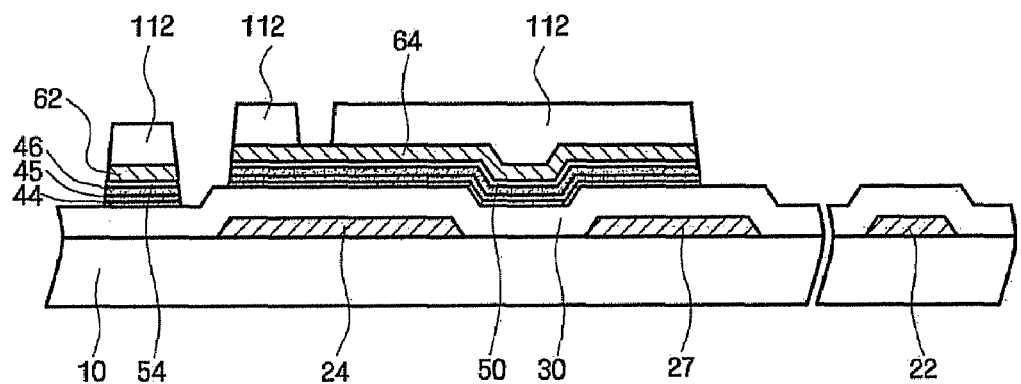

Next, referring to FIGS. 7 and 8, an etching process is performed with respect to a portion of the conductive layer 60 for data wiring corresponding to a region other than the lower portion of the photoresist pattern. In this case, the conductive layer 60 for data wiring may be wet-etched by using the photoresist pattern as an etching mask, and by using an etching solution of, for example, phosphoric acid, nitric acid, acetic acid, etc.

As a result of the etching, a data line 62, a channel portion, and a conductive layer pattern 64 for source/drain electrodes of the conductive layer 60 for data wiring remain, while the other portions of the conductive layer 60 for data wiring are removed, thereby exposing a portion of the doped amorphous silicon layer 50. In this case, the remaining data line 62 and the conductive layer pattern 64 for source/drain electrodes have the same shape as that of a data wiring, except that the source and drain electrodes are not separated but connected.

Next, the exposed portions of doped amorphous silicon layer 50 and the first, third and second active layers 41, 42 and 43 are removed by dry etching using the photoresist pattern as an etching mask, thereby forming a doped amorphous silicon layer pattern 54 and first, third and second active layer patterns 44, 45 and 46. In an exemplary embodiment, this etching is performed under conditions such that the doped amorphous silicon layer 50 and the first, third and second active layers 41, 42 and 43 are simultaneously etched, but the gate insulating layer 30 is not etched. For example, a mixed gas of $SF_6$ and HCl, or a mixed gas of $SF_6$ and $O_2$ may be used at a properly-adjusted composition ratio.

Next, the second region 114 of the photoresist is removed by dry etching. The second region 114 of the photoresist, and a portion of the doped amorphous silicon layer 50 and the first, third and second active layers 41, 42 and 43 may be simultaneously removed by dry etching. In this case, the first region 112 is also etched, thereby reducing the thickness of the first region 112.

Then, photoresist residue left on the surface of the conductive layer pattern 64 for source/drain electrodes of the channel portion is removed through ashing.

Figure 9:
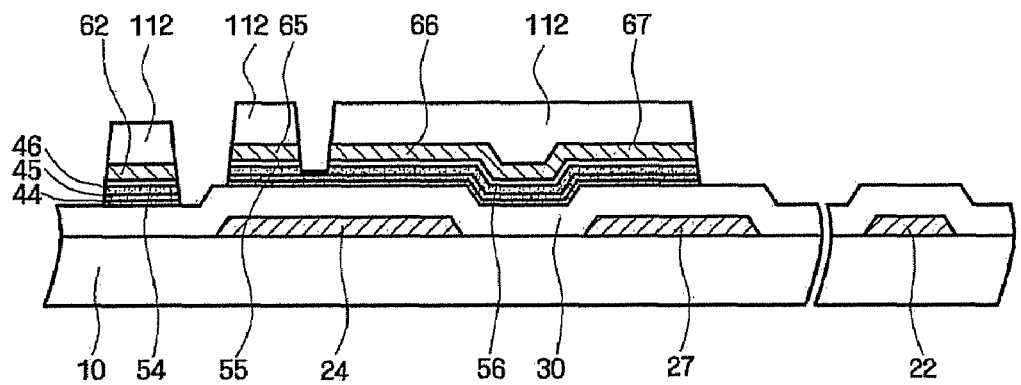

Thereafter, as shown in FIGS. 8 and 9, the conductive layer pattern 64 for source/drain electrodes of the channel portion, that is, the conductive layer pattern 64 for source/drain electrodes beneath the second region 114 of the photoresist (FIG. 7) is removed by dry etching. The conductive layer pattern 64 for source/drain electrodes is dry etched by using, for example, a chlorine-based etching gas. Then, the ohmic contact layer pattern is formed by etching the doped amorphous silicon layer pattern 54 using the first region 112 of the photoresist pattern as an etching mask. In this case, dry etching may be used. Suitable etching gases include, for example, a mixed gas of $CF_4$ and HCl, a mixed gas of $CF_4$ and $O_2$, or a gas having $SF_6$ and $Cl_2$ as a main ingredient. When such an etching gas is used, it is possible to leave the first, third and second active layer patterns 44, 45 and 46 (including genuine amorphous silicon) with a uniform thickness. In this case, a portion of the first, third and second active layer patterns 44, 45 and 46 may be removed to reduce the thickness thereof, and the first region 112 of the photoresist pattern may also be etched to a predetermined thickness. In an exemplary embodiment, this etching should be performed under conditions such that the gate insulating layer 30 is not etched, and that the photoresist pattern is thick enough so as not to expose the data wiring 62, 65, 66 and 67 beneath the first region 112 through the etching of the first region 112.

Then, the source electrode 65 and drain electrode 66 are separated, and the data wiring 62, 65, 66 and 67 and ohmic contact layers 55 and 56 beneath the data wiring are completed.

Figure 10:
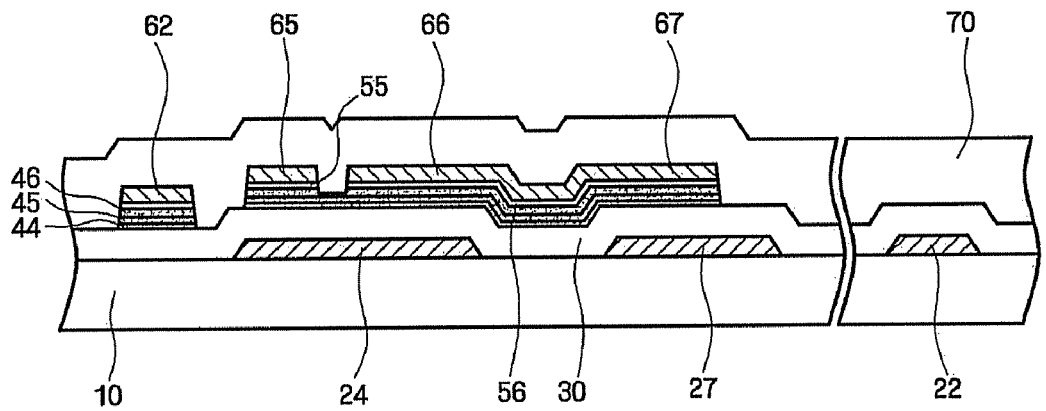

Next, referring to FIGS. 9 and 10, the first region 112 of the photoresist left on the data wiring is stripped and removed. Then, a single layer or a multi-layer made of a photosensitive organic material having a good flatness characteristic, for example, a low dielectric insulating material such as a-Si:C:O and a-Si:O:F formed by plasma enhanced chemical vapor deposition (PECVD), or an inorganic material such as silicon nitride (SiNx) is formed on the front surface of the insulating substrate 10, thereby forming a passivation layer 70.

Figure 11:
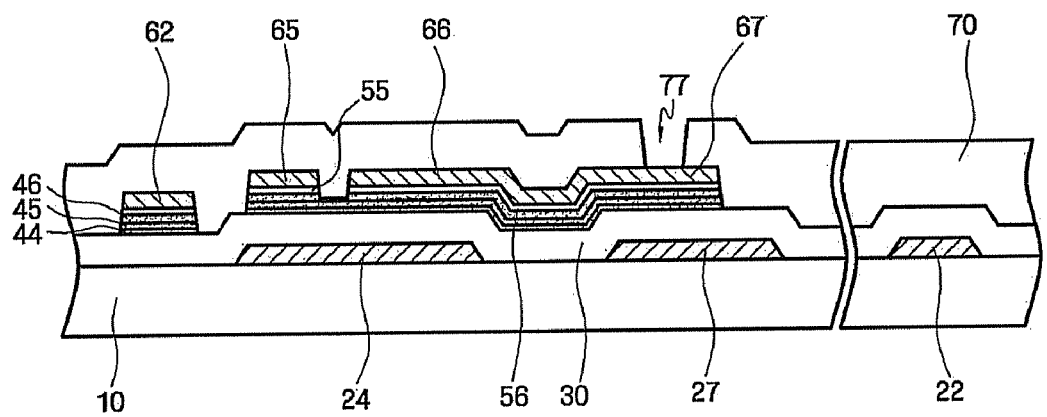

Thereafter, referring to FIGS. 10 and 11, the passivation layer 70 is photo-etched together with the gate insulating layer 30 to form a contact hole 77 exposing a drain electrode expanded part 67.

Figure 12:
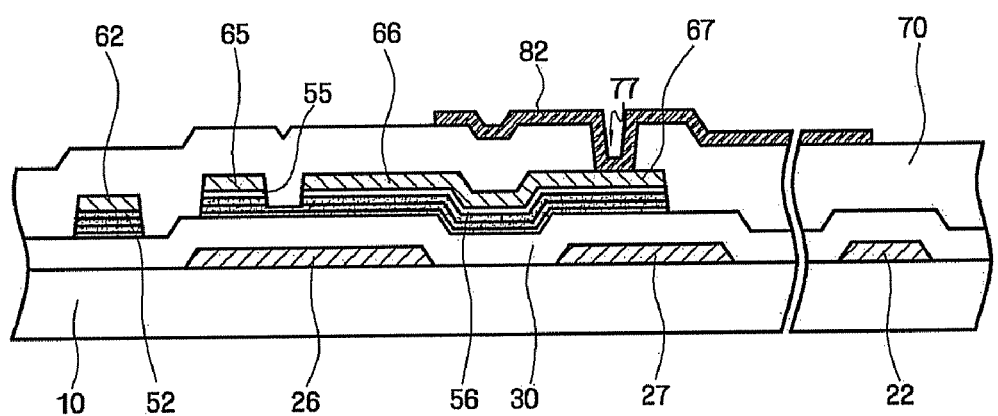

Finally, referring to FIGS. 11 and 12, conductive material having an exemplary thickness of about 40 to about 50 nm is deposited on the resultant substrate and is photo-etched, so that a pixel electrode 82 is formed, connected to the drain electrode expanded part 67 through the contact hole 77, thereby completing a thin film transistor substrate 1. Herein, the conductive material for pixel electrodes may be, for example, indium tin oxide "ITO" or indium zinc oxide "IZO."

Although not specifically shown, additional methods of forming the pixel electrode 82 are also contemplated. According to a modified example of the present invention, after a passivation layer 70 (FIG. 10) is formed, a photoresist pattern (not shown) is formed on a portion, exempting the pixel region, and then the passivation layer and the gate insulating layer 30 (FIG. 10) are patterned. Thereafter, a conductive material (not shown) is applied to the entire surface of the insulating substrate 10 (FIG. 10), and the photoresist pattern and the conductive material are lifted off by a stripper to be removed, thereby forming the pixel electrode 82 in the pixel region. In this case, the pixel electrode may be formed directly on the insulating substrate.

Figure 13:
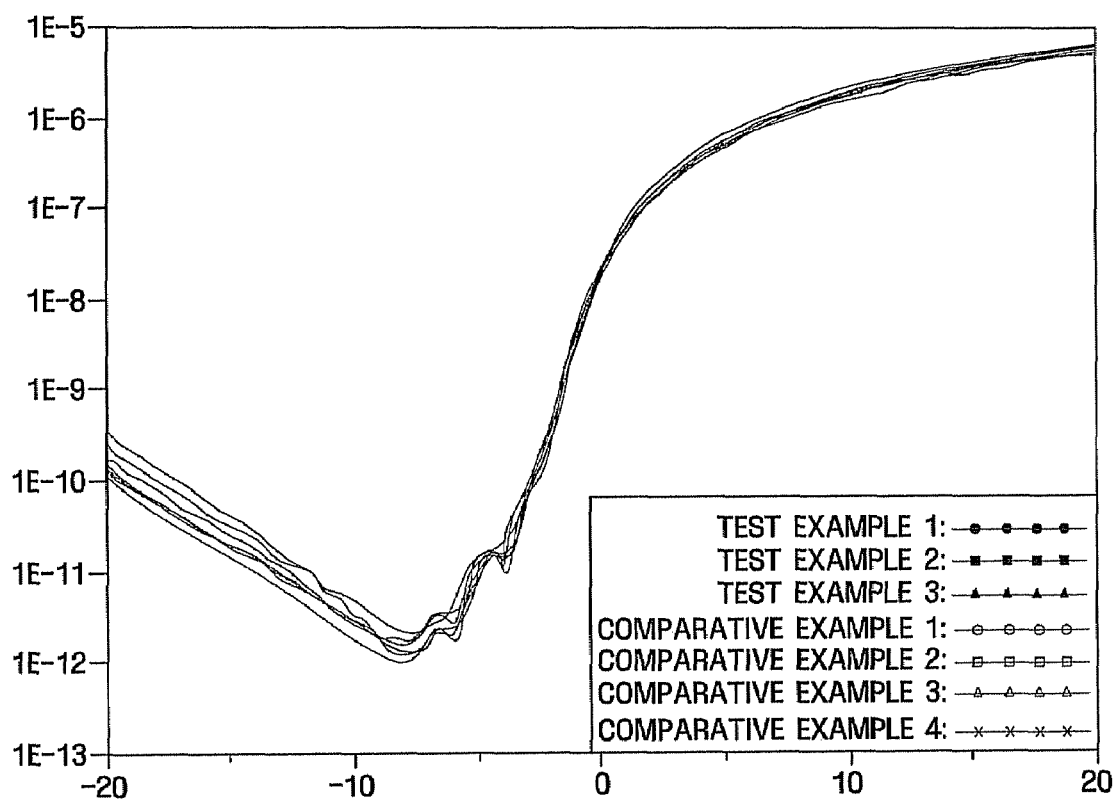
FIG. 13 is a comparison graph illustrating the carrier mobilities of thin film transistors according to the first embodiment of the present invention.
Figure 14:
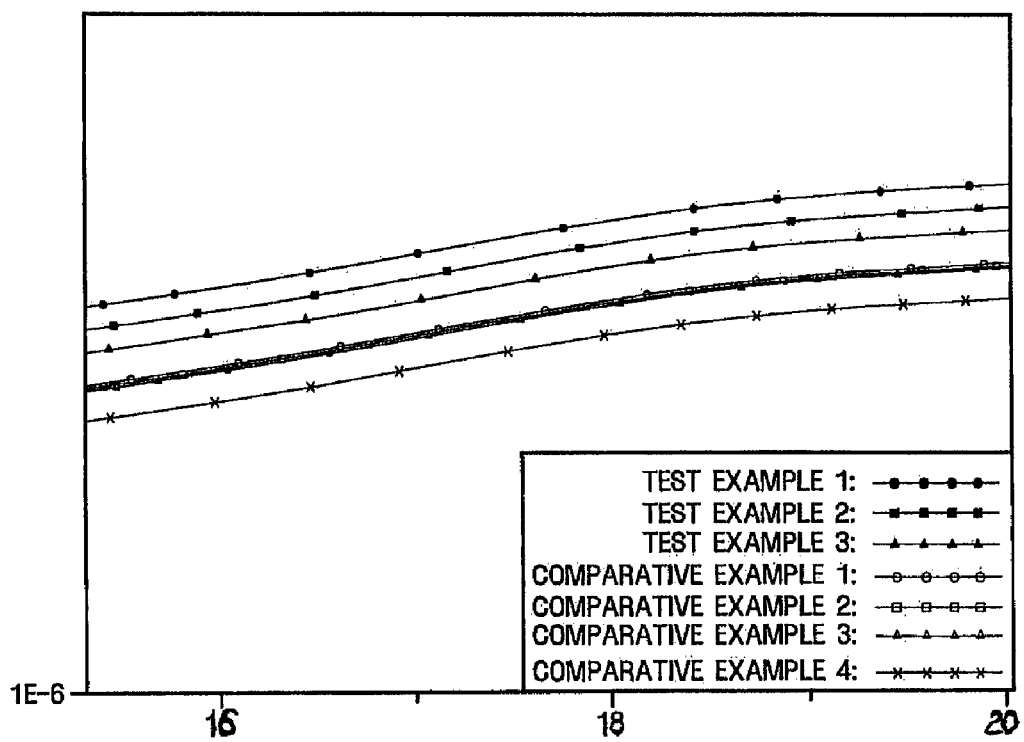
FIG. 14 is an enlarged graph of FIG. 13.

Hereinafter, the carrier mobility characteristics and film quality characteristics of a thin film transistor substrate fabricated in accordance with the above described embodiment of the present invention will be described with reference to test examples 1 to 3, comparative examples 1 to 4, and FIGS. 12, 13 and 14. FIG. 13 is a comparison graph illustrating the carrier mobilities of thin film transistor substrates according to the first embodiment of the present invention. FIG. 14 is an enlarged graph of FIG. 13.

TEST EXAMPLE 1

The gate insulating layer 30 was formed in a double-layered structure having a thickness of 400 nm and a thickness of 50 nm, and a first hydrogen plasma treatment was performed with respect to the gate insulating layer. Thereafter, hydrogenated amorphous silicon, in which the ratio of silane to hydrogen is 1:6, was deposited at a temperature of 320° C. at a deposition rate of 0.65 nm/s, thereby forming the first active layer 41 with a thickness of 10 nm. Next, a second hydrogen plasma treatment was performed with respect to the first active layer 41. In this case, the treatment was performed under the conditions of: 0.06 $W/cm^2$ of power per unit area applied to the chamber; a pressure of 1200 mT within the chamber; 1500 sccm of hydrogen introduced in the chamber; and 100 seconds of treatment time. Hydrogenated amorphous silicon was deposited on the first active layer 41, which had been subjected to the second hydrogen plasma treatment, in the same conditions as those for deposition of the first active layer 41, thereby forming the third active layer 42 with a thickness of 60 nm. Subsequently, hydrogenated amorphous silicon was deposited at a deposition rate of 2.01 nm/s, thereby forming the second active layer 43 with a thickness of 130 nm. Thereafter, a thin film transistor substrate was completed through the following process according to the first embodiment of the present invention. Next, when a gate-on voltage (Von) of 20 V and a gate-off voltage (Voff) of −7 V were applied to the device, a gate-on current (Ion) and a gate-off current (Ioff) flowing in the channel region were respectively measured (illustrated in FIGS. 13 and 14), and carrier mobilities were measured (Table 1) as a result of the measurement.

TEST EXAMPLE 2

This experiment was performed under the same conditions as those of test example 1, except that the first active layer 41 was formed to have a thickness of 15 nm and the third active layer 42 was formed to have a thickness of 55 nm.

TEST EXAMPLE 3

This experiment was performed under the same conditions as those of test example 1, except that the first active layer 41 was formed to have a thickness of 20 nm, and the third active layer 42 was formed to have a thickness of 50 nm.

COMPARATIVE EXAMPLE 1

This experiment was performed under the same conditions as those of test example 1, except that only silane was used when the first active layer 41 was deposited.

COMPARATIVE EXAMPLE 2

This experiment was performed under the same conditions as those of test example 1, except that only silane was used when the first active layer 41 was deposited, and that the first active layer 41 was formed to have a thickness of 15 nm and the third active layer 42 was formed to have a thickness of 55 nm.

COMPARATIVE EXAMPLE 3

This experiment was performed under the same conditions as those of test example 1, except that only silane was used when the first active layer 41 was deposited, the first active layer 41 was formed to have a thickness of 20 nm, and the third active layer 42 was formed to have a thickness of 50 nm.

COMPARATIVE EXAMPLE 4

This experiment was performed under the same conditions as those of test example 1, except that the second hydrogen plasma treatment was not performed, the first active layer 41 was formed to have a thickness of 70 nm, and the third active layer 42 was not formed.

TABLE 1

|  | Ion (+20 V)[A] | Charge Mobility [cm$^2$/V · sec] | Ioff (−7 V)[A] |
|---|---|---|---|
| test ex. 1 | $5.25 \times e^{-06}$ | 0.69 | $1.37 \times e^{-12}$ |
| test ex. 2 | $6.33 \times e^{-06}$ | 0.83 | $2.35 \times e^{-12}$ |
| test ex. 3 | $5.92 \times e^{-06}$ | 0.75 | $2.33 \times e^{-12}$ |
| Comparative ex. 1 | $5.35 \times e^{-06}$ | 0.70 | $1.57 \times e^{-12}$ |
| Comparative ex. 2 | $5.33 \times e^{-06}$ | 0.71 | $1.52 \times e^{-12}$ |
| Comparative ex. 3 | $5.68 \times e^{-06}$ | 0.75 | $2.36 \times e^{-12}$ |
| Comparative ex. 4 | $5.00 \times e^{-06}$ | 0.65 | $2.45 \times e^{-12}$ |

As confirmed by the results shown in FIGS. 13 and 14 and Table 1, the thin film transistor substrates according to test examples 1 to 3, in which the first active layers 41 were formed using silane diluted with hydrogen and were subjected to the second hydrogen plasma treatment, had higher carrier mobilities than those according to comparative examples 1 to 4, in which the first active layers 41 were formed using only silane or the hydrogen plasma treatment was not performed.

The carrier mobility is expressed by the equation:

$$\text{Charge Mobility} = (\text{Ion} \times L)/[C_{SiNx} \times W \times \{Vds \times (Vgs - Vth) - (Vds^2)/2\}],$$

where "Ion" represents current flowing in a channel region when a gate-on signal is applied, "L" represents a channel length, "$C_{SiNx}$" represents the permittivity of a gate insulating layer, "W" represents a channel width, "Vds" represents a potential difference between source and drain electrodes, "Vgs" represents a potential difference between source and gate electrodes, and "Vth" represents a threshold voltage.

It can be understood from the above equation that when the size and aperture ratio of a thin film transistor substrate are constant, the carrier mobility depends on the "Ion". According to the results illustrated in Table 1, it will be understood that the thin film transistor substrates according to the test examples, in which silane diluted with hydrogen was deposited and the second hydrogen plasma treatment was performed when the first active layer 41 was formed, have larger current "Ion", and thus provide improved carrier mobilities, as compared with the thin film transistor substrates according to the comparative examples, in which none or only part of these processes was performed.

The film quality characteristics of the thin film transistor substrates fabricated according to these test examples can be confirmed from Table 2.

TABLE 2

|  | Number of Si—H Bonds | Number of Si—H$_2$ Bonds | Number of Si—H Bonds/Number of Si—H$_2$ Bonds |
|---|---|---|---|
| 1$^{st}$ Active Layer Pattern of test Ex. 1 | 0.0095 | 0.0004 | 23.75 |
| 1$^{st}$ Active Layer Pattern of Comparative Ex. 4 | 0.0109 | 0.0018 | 6.00 |
| 2$^{nd}$ Active Layer Pattern of Comparative Ex. 4 | 0.0117 | 0.0022 | 5.293 |

As shown in Table 2, it can be confirmed that the number of Si—H bonds and the number of Si—H$_2$ bonds per unit area contained in the first active layer pattern 44 of the thin film transistor substrate fabricated according to test example 1 were significantly reduced, as compared with those according to comparative example 4. In addition, it can be confirmed that the value of "the number of Si—H bonds/the number of Si—$H_2$ bonds" in the thin film transistor substrate according to test example 1 was significantly higher than that according to comparative example 4, and had a relatively small number of Si—$H_2$ bonds, which are unstable bonds. It is clear that these values according to test example 1 are better than those of the second active layer pattern according to comparative example 4, which was deposited at the second deposition rate, and thus had sparse film quality. From such film quality characteristics, it is possible to demonstrated the improved carrier mobility of the thin film transistor substrate fabricated according to the exemplary fabrication method described above.

When the first active layer 41 is formed, silane diluted with hydrogen is applied at the first deposition rate to form a layer, and processes including the second hydrogen plasma treatment are performed to fabricate the thin film transistor substrate, thereby improving the carrier mobility in the channel region, so that the aperture ratio increases, and the size of the thin film transistor substrate is reduced. In addition, the parasitic capacity also decreases and this reduces the kick-back voltage, and the luminance increases. Accordingly, the need to use a high-priced optical film is obviated, thereby reducing the fabrication cost for the thin film transistor substrate.

Hereinafter, a method of fabricating a thin film transistor substrate according to a second embodiment of the present invention will be described in detail with reference to FIGS. 15 to 19 and FIGS. 1 to 5. FIGS. 15 to 19 are cross-sectional views illustrating a method of fabricating a thin film transistor substrate according to a second embodiment of the present invention. For ease and convenience of description, components having the same or similar functions as those of the first embodiment use the same reference numerals as those in the first embodiment, and a detailed description thereof will be omitted or simplified.

According to another exemplary method of fabricating a thin film transistor substrate based on the second embodiment of the present invention, a gate wiring 22, 24 and 27 including a gate line 22, a gate electrode 24 and a storage wiring 27, and a dual-layered gate insulating layer 30 made of silicon nitride ($SiN_x$) are sequentially deposited on an insulating substrate 10, and then a first hydrogen plasma treatment is performed with respect to the resultant substrate, through the steps described with reference to FIGS. 1 to 5 according to the first embodiment of the present invention.

Next, for example, hydrogenated amorphous silicon or polycrystalline silicon is deposited at a first deposition rate on the gate insulating layer 30 (which has been subjected to the first hydrogen plasma treatment), thereby forming a first active layer 41 with a first thickness. In this case, the deposition conditions, such as deposition rate, deposition temperature and deposition thickness, are the same as those of the first embodiment of the present invention. Subsequently, a second hydrogen plasma treatment is performed with respect to the first active layer 41. In this case, the treatment condition for the second hydrogen plasma treatment is the same as that of the first embodiment of the present invention, so that the first active layer 41 contains more Si—H bonds than Si—$H_2$ bonds therein, thereby having a dense film quality characteristic.

Then, hydrogenated amorphous silicon is deposited at a first rate on the first active layer 41 (which has been subjected to the second hydrogen plasma treatment), thereby forming a third active layer 42 with a third thickness. Similar to the first embodiment of the present invention, when sufficient carrier mobility can be obtained with only the first active layer 41 being plasma-processed, it is possible to omit the third active layer 42 in order to reduce the process time.

Next, for example, hydrogenated amorphous silicon or polycrystalline silicon is deposited at a second deposition rate higher than the first deposition rate on the third active layer 42 or on the first active layer 41 which has been hydrogen-plasma-processed, thereby forming a second active layer 43 with a second thickness greater than the first thickness.

Figure 15:
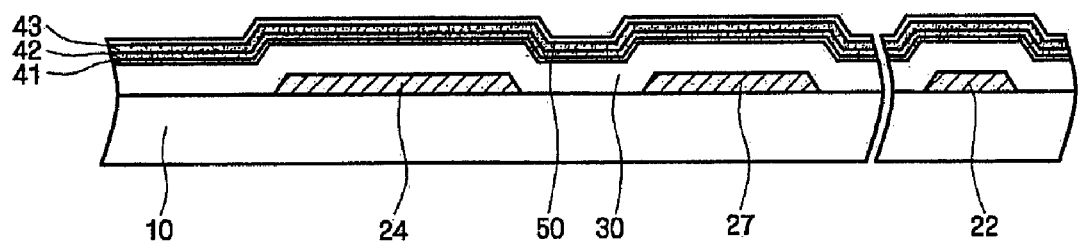
FIGS. 15 to 19 are cross-sectional views illustrating a method of fabricating a thin film transistor substrate according to a second embodiment of the present invention.

Then, referring to FIG. 15, a doped amorphous silicon layer 50 is deposited on the resultant substrate, for example, with a thickness of 50 nm by means of chemical vapor deposition.

Figure 16:
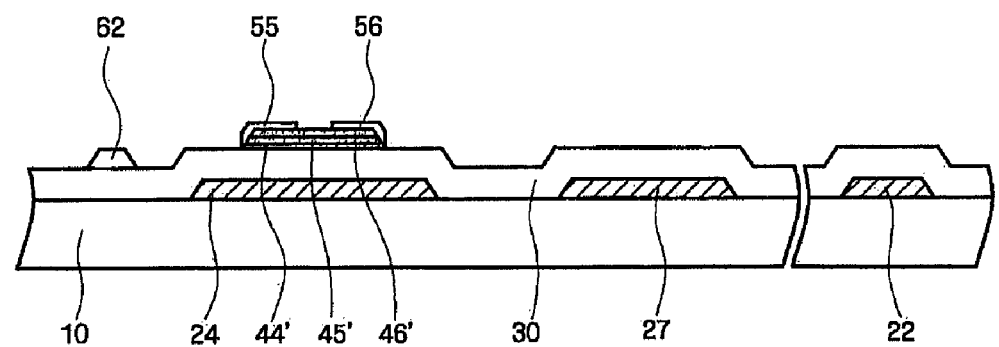

Thereafter, referring to FIG. 16, the previously-formed doped amorphous silicon layer 50 is photo-etched together with the first, third and second active layers 41, 42 and 43, thereby forming first, third and second active layer patterns 44', 45' and 46' on top of the gate electrode 24. Ohmic contact layers 55 and 56 are also formed on top of the active layer patterns 44', 45' and 46'. The first, third and second active layer patterns 44', 45' and 46' and the ohmic contact layers 55 and 56 may be formed to entirely overlap with the gate electrode 24, for example, in the form of an island. Also, first, third and second active layer patterns 44', 45' and 46' may have the same thickness as that of the first, third and second active layers 41, 42 and 43.

Figure 17:
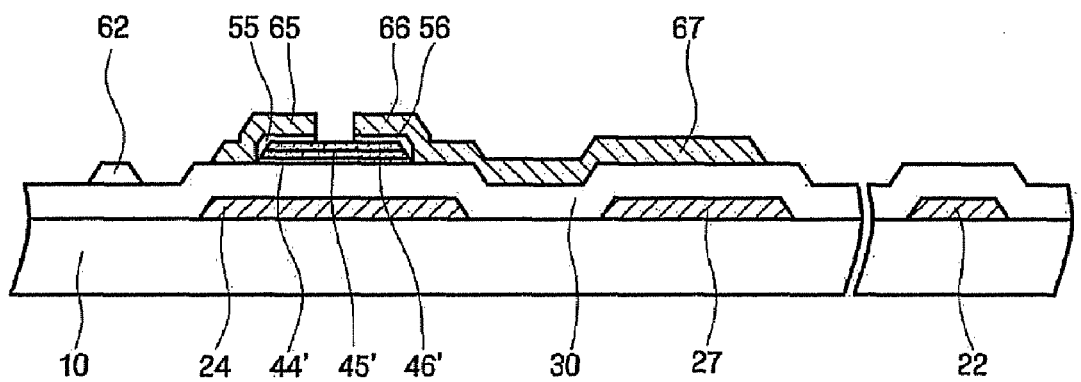

Thereafter, referring to FIG. 17, a data wiring 62, 65, 66 and 67 is formed on the gate insulating layer 30, the exposed first, third and second active layer patterns 44', 45' and 46', and the ohmic contact layers 55 and 56 by means of a sputtering scheme or the like.

In so doing, the data wiring 62, 65, 66 and 67 is divided into two sides with the gate electrode 24 centered below, thereby forming a source electrode 55 and a drain electrode 56.

Figure 18:
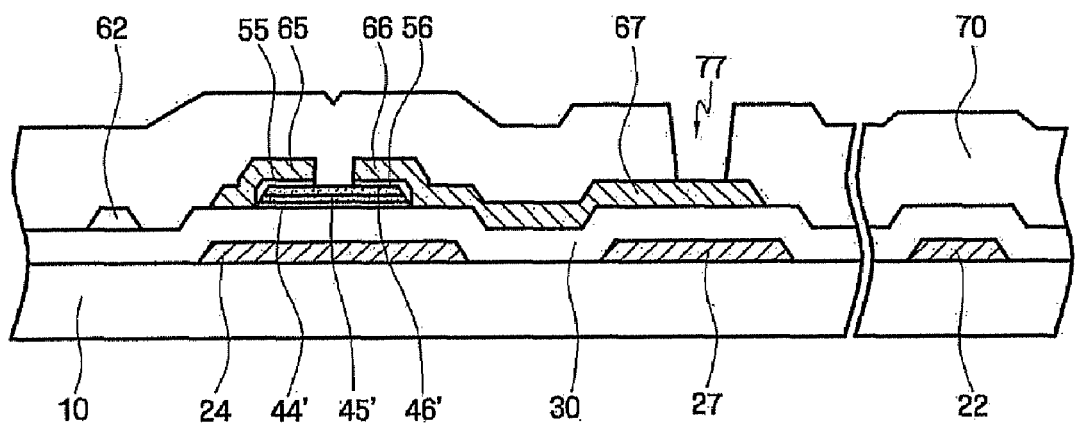

Then, referring to FIG. 18, a single layer or a multi-layer is formed of photosensitive organic material having a good flatness characteristic or of an inorganic material such as silicon nitride ($SiN_x$), thereby forming a passivation layer 70. Next, photo-etching is performed to form a contact hole 77 exposing a drain electrode expanded part 67.

Figure 19:
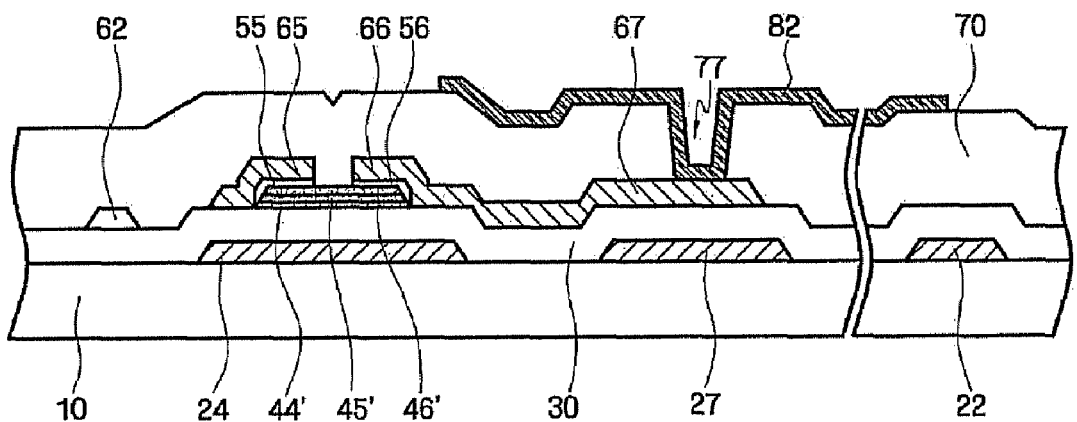

Finally, referring to FIG. 19, a conductive material such as, for example, ITO or IZO, is deposited and photo-etched, so that a pixel electrode 82 connected to the drain electrode expanded part 67 through the contact hole 77 is formed, thereby completing a thin film transistor substrate.

Although not specifically shown, additional methods of forming the pixel electrode 82 are also contemplated. Similar to the modified example of the first embodiment of the present invention, after a passivation layer 70 (FIG. 18) is formed, a photoresist pattern (not shown) is formed on a portion, exempting a pixel region, and then the passivation layer and gate insulating layer 30 (FIG. 19) is patterned. In this case, it is possible to omit the contact hole 77 (FIG. 18) on the passivation layer. Thereafter, a conductive material (not shown) is applied to the front surface of the insulating substrate 10 (FIG. 19), and the photoresist pattern and the conductive material are lifted off by a stripper to be removed, thereby forming the pixel electrode 82 in the pixel region. In this case, the pixel electrode may be formed directly on the insulating substrate 10.

As described above, the method of fabricating a thin film transistor substrate according to the exemplary embodiments of the present invention have the following effects.

First, the film quality characteristic of the first active layer is improved, and the carrier mobility in the channel region becomes higher, thereby reducing the channel width and improving the aperture ratio, so that it is possible to reduce the size of the thin film transistor substrate.

Secondly, the driving voltage is lowered due to the increase of the carrier mobility in the channel region, and parasitic capacity is reduced due to the reduction of the channel width, so that it is possible to prevent a pixel error caused by a kickback voltage.

Thirdly, the permeability increases due to the improvement of the aperture ratio, so that the need for a high-priced optical film is obviated, thereby reducing the fabrication cost for the thin film transistor substrate.

Although exemplary embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method of fabricating a thin film transistor substrate, the method comprising:
    forming a gate wiring on an insulating substrate and forming a gate insulating layer on the gate wiring;
    performing a first hydrogen plasma treatment with respect to the gate insulating layer;
    forming a first active layer with a first thickness at a first deposition rate on the gate insulating layer;
    performing a second hydrogen plasma treatment with respect to the first active layer; and
    forming, on the first active layer, a second active layer with a second thickness greater than the first thickness at a second deposition rate greater than the first deposition rate,
    wherein, in the first active layer subjected to the second hydrogen plasma treatment, a ratio of a number of Si—H bonds to a number of Si—$H_2$ bonds is within a range of about 15:1 to about 30:1.

2. The method of claim 1, wherein, in the first active layer subjected to the second hydrogen plasma treatment, the ratio of a number of Si—H bonds to a number of Si—$H_2$ bonds is within a range of about 20:1 to about 25:1.

3. The method of claim 1, wherein the first active layer is formed within a temperature range of about 150 to about 350° C.

4. The method of claim 1, wherein the first deposition rate is within a range of about 0.6 to about 1.2 nm/s.

5. The method of claim 1, wherein the second deposition rate is within a range of about 1.5 to about 2.5 nm/s.

6. The method of claim 1, further comprising:
    sequentially forming a doped amorphous silicon layer and a conductive layer for data wiring on the second active layer; and
    patterning the first and second active layers, the doped amorphous silicon layer and the conductive layer for data wiring by using an etching mask.

7. The method of claim 1, further comprising:
    forming a doped amorphous silicon layer;
    forming first and second active layer patterns and an ohmic contact layer by pattering the first and second active layers and the doped amorphous silicon layer; and
    forming and patterning a conductive layer for data wiring on the ohmic contact layer.

8. The method of claim 1, wherein, during the second hydrogen plasma treatment, power per unit area applied to a chamber is within a range of about 0.04 to about 0.06 W/$cm^2$.

9. The method of claim 8, wherein, during the second hydrogen plasma treatment, pressure applied to the chamber is within a range of about 1,000 to about 1,600 mT.

10. The method of claim 9, wherein, during the second hydrogen plasma treatment, hydrogen at a flow rate of about 1,000 to about 2,000 sccm is supplied.

11. The method of claim 10, wherein, during the second hydrogen plasma treatment, a processing time is within a range of about 60 to about 120 seconds.

12. The method of claim 1, wherein the first thickness is within a range of about 10 to about 30 nm.

13. The method of claim 12, further comprising forming a third active layer with a third thickness at the first deposition rate, after the second hydrogen plasma treatment.

14. The method of claim 13, wherein the third thickness is within a range of about 40 to about 60 nm.

15. The method of claim 1, wherein the first active layer comprises hydrogenated amorphous silicon.

16. The method of claim 15, wherein the hydrogenated amorphous silicon is formed by diluting silane with hydrogen.

17. The method of claim 16, wherein a composition ratio of the silane to the hydrogen is within a range of about 1:4 to 1:8.

18. A thin film transistor substrate comprising:
    a gate wiring formed on an insulating substrate;
    a gate insulating layer formed on the gate wiring;
    a first active layer formed with a first thickness on the gate insulating layer in which a ratio of a number of Si—H bonds to a number of Si—$H_2$ bonds is within a range of about 15:1 to about 30:1; and
    a second active layer formed with a second thickness greater than the first thickness on the first active layer, in which a ratio of a number of Si—H bonds to a number of Si—$H_2$ bonds is within a range of about 0.1:1 to about 14.9:1.

19. The thin film transistor substrate of claim 18, wherein the first thickness is within a range of about 10 to about 30 nm.

20. The thin film transistor substrate of claim 19, further comprising a third active layer formed with a third thickness between the first and second active layers.

21. The thin film transistor substrate of claim 20, wherein the third thickness is within a range of about 40 to about 60 nm.

22. The thin film transistor substrate of claim 18, wherein, in the first active layer, the ratio of a number of Si—H bonds to a number of Si—$H_2$ bonds is within a range of about 20:1 to about 25:1.

23. The thin film transistor substrate of claim 22, wherein, in the second active layer, the ratio of a number of Si—H bonds to a number of Si—H2 bonds is within a range of about 5:1 to about 6:1.

* * * * *